(12) United States Patent
Shimomura et al.

(10) Patent No.: US 9,577,107 B2
(45) Date of Patent: Feb. 21, 2017

(54) OXIDE SEMICONDUCTOR FILM AND METHOD FOR FORMING OXIDE SEMICONDUCTOR FILM

(71) Applicant: Semiconductor Energy Laboratory Co., Ltd., Atsugi-shi, Kanagawa-ken (JP)

(72) Inventors: Akihisa Shimomura, Atsugi (JP); Takahisa Ishiyama, Atsugi (JP); Masaki Koyama, Atsugi (JP); Erumu Kikuchi, Isehara (JP); Takuya Hirohashi, Atsugi (JP); Masashi Oota, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 252 days.

(21) Appl. No.: 14/208,982

(22) Filed: Mar. 13, 2014

(65) Prior Publication Data
US 2014/0284597 A1    Sep. 25, 2014

(30) Foreign Application Priority Data

Mar. 19, 2013 (JP) ................................. 2013-056982

(51) Int. Cl.
*H01L 21/00* (2006.01)
*H01L 29/786* (2006.01)
(Continued)

(52) U.S. Cl.
CPC ..... *H01L 29/7869* (2013.01); *H01L 21/02554* (2013.01); *H01L 21/02565* (2013.01);
(Continued)

(58) Field of Classification Search
None
See application file for complete search history.

(56) References Cited

U.S. PATENT DOCUMENTS 5,731,856 A    3/1998 Kim et al.
5,744,864 A    4/1998 Cillessen et al.
(Continued)

FOREIGN PATENT DOCUMENTS

EP    1737044 A    12/2006
EP    2226847 A    9/2010
(Continued)

OTHER PUBLICATIONS

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

(Continued)

*Primary Examiner* — Jack Chen
(74) *Attorney, Agent, or Firm* — Robinson Intellectual Property Law Office; Eric J. Robinson

(57) ABSTRACT

To improve crystallinity of an oxide semiconductor. To provide a crystalline oxide semiconductor film in which a crystallized region extends to the interface with a base or the vicinity of the interface, and to provide a method for forming the oxide semiconductor film. An oxide semiconductor film containing indium, gallium, and zinc is formed, and the oxide semiconductor film is irradiated with an energy beam, thereby being heated. Note that the oxide semiconductor film includes a c-axis aligned crystal region or microcrystal.

8 Claims, 12 Drawing Sheets

(51) Int. Cl.
*H01L 21/02* (2006.01)
*H01L 29/66* (2006.01)
(52) U.S. Cl.
CPC .. *H01L 21/02631* (2013.01); *H01L 21/02678* (2013.01); *H01L 21/02686* (2013.01); *H01L 29/66969* (2013.01)

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,884,360 B2 | 2/2011 | Takechi et al. |
| 8,237,166 B2 | 8/2012 | Kumomi et al. |
| 8,420,442 B2 | 4/2013 | Takechi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140053 A1 | 6/2009 | Yamazaki et al. |
| 2009/0140255 A1 | 6/2009 | Kimura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0123132 A1 | 5/2010 | Nakata et al. |
| 2010/0320458 A1 | 12/2010 | Umeda et al. |
| 2011/0068336 A1 | 3/2011 | Yamazaki et al. |
| 2011/0127579 A1 | 6/2011 | Yamazaki |
| 2012/0286260 A1 | 11/2012 | Noda et al. |
| 2013/0009147 A1* | 1/2013 | Koyama ........... H01L 21/02422 257/43 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2008-042088 | 2/2008 |
| JP | 2010-123758 | 6/2010 |
| WO | WO-2004/114391 | 12/2004 |

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceeding of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs", IDW '02 : Proceedings of The 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array", SID Digest '08 Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Miyasaka.M, "SUFTLA Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

(56) References Cited

OTHER PUBLICATIONS

Kikuchi.H et al., "39.1:Invited Paper:Optically Isotropic Nano-Structured Liquid Crystal Composites for Display Applications", SID Digest '09 : SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", Nirim Newsletter, Mar. 1, 1995, vol. 150, pp. 1-4.

Kikuchi.H et al., "Polymer-Stabilized Liquid Crystal Blue Phases", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and ScO3—A2O3—BO Systems [A; Fe, Ga, Or, Al; B: Mg, Mn, Fe, Ni, Cu,Or Zn] at Temperatures Over 1000° C", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display" SID International Symposium Digest of Technical Papers, May 20, 2008, vol. 39, pp. 629-632.

Orita.M et al., "Mechanism of Electrical Conductivity of Transparent InGaZnO4", Phys. Rev. B. (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Display Workshops, Dec. 3, 2008, pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers", J. Electrochem. Soc. (Journal of The Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Izumi.F et al., "Three-Dimensional Visualization in Powder Diffraction", Diffusion and Defect Data. Solid State Data. Part B, Solid State Phenomena, Dec. 1, 2007, vol. 130, pp. 15-20.

Wendschuh-Josties et al., "Lattice and oxygen parameters of $ZnGa_2O_4$ as a function of equilibration temperature," Neues Jahrb Mineral Monatsh, Jun. 1, 1995, vol. 1995, No. 6, pp. 273-280.

Shannon, "Revised effective ionic radii and systematic studies of interatomic distances in halides and chalcogenides," Acta. Cryst. (Acta Crystallographica Section A), Sep. 1, 1976, vol. 32, No. 5, pp. 751-767.

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

\* cited by examiner

OXIDE SEMICONDUCTOR FILM AND METHOD FOR FORMING OXIDE SEMICONDUCTOR FILM

BACKGROUND OF THE INVENTION

1. Field of the Invention

The present invention relates to an oxide semiconductor film and a method for forming an oxide semiconductor film.

2. Description of the Related Art

An oxide semiconductor has attracted attention as a material for transistors. The oxide semiconductor is said to have a feature similar to that of amorphous silicon capable of being formed at a low temperature, and a feature similar to that of polycrystalline silicon having high field-effect mobility. For example, the following is disclosed: a field-effect transistor using an amorphous oxide, whose electron carrier concentration is controlled, and an image display device using the transistor (Patent Document 1).

The transistor using an amorphous oxide semiconductor formed at room temperature, however, has a problem in characteristics: not enough high field-effect mobility, low reliability, and large hysteresis. In order to solve such a problem, a technique of crystallizing an oxide semiconductor by laser irradiation is disclosed (see Patent Documents 2 and 3). These documents indicate that an amorphous oxide semiconductor can be crystallized by being irradiated with a laser.

REFERENCE

Patent Document

[Patent Document 1] Japanese Published Patent Application No. 2006-165528
[Patent Document 2] Japanese Published Patent Application No. 2008-042088
[Patent Document 3] Japanese Published Patent Application No. 2010-123758

SUMMARY OF THE INVENTION

In crystallization of oxide semiconductors and other semiconductors, there is a problem in that an amorphous region remains in the vicinity of the interface between a base and the semiconductor film to be crystallized. For example, in the case where an element such as a transistor is manufactured using an oxide semiconductor film, the oxide semiconductor film is formed on a base such as a glass substrate or an insulating film like a silicon oxide film. In crystallization of an oxide semiconductor film formed on such an insulating material different from the oxide semiconductor, the problem arises in that a region near the interface with the base cannot be crystallized and an amorphous region remains.

It is needless to say that the oxide semiconductor film can be made thick so that a crystalline region in a surface layer is used. In order to reduce parasitic capacitance and operate the transistor at low power consumption, however, the oxide semiconductor film needs to be made thin so that the channel region is completely depleted. In that case, conventional techniques, which have difficulty in crystallizing the immediate vicinity of the interface with the base, prevent miniaturization of transistors.

Thus, even when the upper layer side of the oxide semiconductor film is crystallized, an amorphous region remains at the interface with the base insulating film, which has adversely affected the characteristics of transistors and the like.

In order to solve the above problem, an object of one embodiment of the present invention is to improve crystallinity of an oxide semiconductor. Specifically, an object is to provide a crystalline oxide semiconductor film in which a crystallized region extends to the interface with a base or the vicinity of the interface and to provide a method for forming the crystalline oxide semiconductor film.

One embodiment of the present invention is a method for forming an oxide semiconductor film including steps of forming an oxide semiconductor film including a c-axis aligned crystal region and containing indium, gallium, and zinc, and heating the oxide semiconductor film by irradiating the oxide semiconductor film with an energy beam.

Another embodiment of the present invention is a method for forming an oxide semiconductor film including steps of forming an oxide semiconductor film including a microcrystal and containing indium, gallium, and zinc, and heating the oxide semiconductor film by irradiating the oxide semiconductor film with an energy beam.

In the above method, the irradiation with an energy beam makes the oxide semiconductor film have a $YbFeO_3(FeO)$-like layered crystal structure forming a homologous phase (hereinafter, the structure is referred to as homologous) in a surface layer and have spinel-like (atomic) arrangement (hereinafter, referred to as spinel) inside the film, and the surface layer of the oxide semiconductor film is removed to expose the spinel.

Another embodiment of the present invention is an oxide semiconductor film, a surface layer of which is homologous and an inside of which is spinel.

In the above structure, the oxide semiconductor film includes microcrystal and contains indium, gallium, and zinc.

According to one embodiment of the present invention, crystallinity of an oxide semiconductor can be improved. In other words, a crystalline oxide semiconductor film in which a crystallized region extends to an interface with a base or the vicinity thereof, and a method for forming the oxide semiconductor film can be provided.

DETAILED DESCRIPTION OF THE INVENTION

Figure 1A:
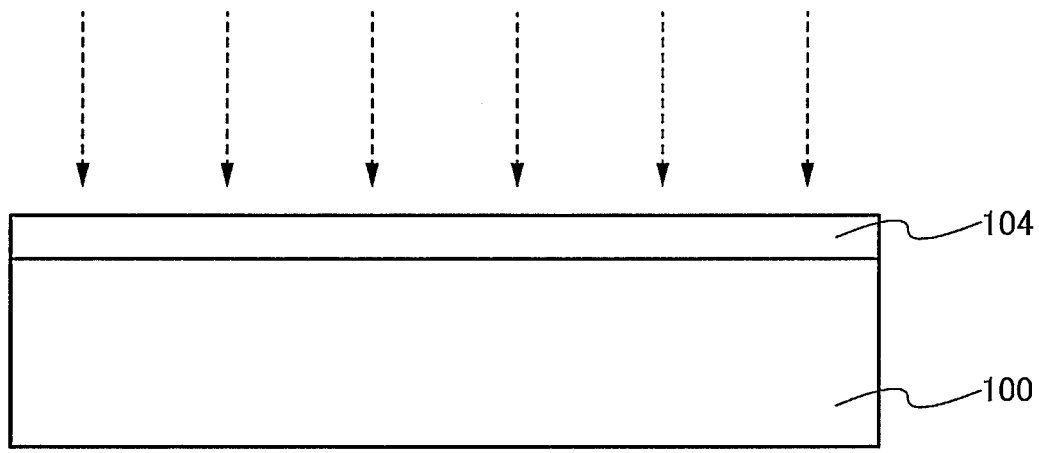
FIGS. 1A and 1B illustrate a method for forming an oxide semiconductor film.

Embodiment of the invention disclosed in this specification will be described with reference to drawings. Note that the invention disclosed in this specification is not limited to the following embodiment, and it is easily understood by those skilled in the art that modes and details can be modified in a wide variety of ways without departing from the spirit and scope of the invention. Accordingly, the disclosed invention should not be construed as being limited to the description of the embodiments to be given below.

When a component is mentioned as being "over" or "under" another component in this specification, the two components are in direct contact with each other in some cases; however, another component may be present between the two components in other cases.

In embodiments hereinafter described, the same parts are denoted with the same reference numerals throughout the drawings in some cases. Note that components illustrated in the drawings, that is, a thickness or a width of a layer, a region, or the like, a relative position, and the like are exaggerated in some cases for clarification in description of embodiments.

Figure 1B:
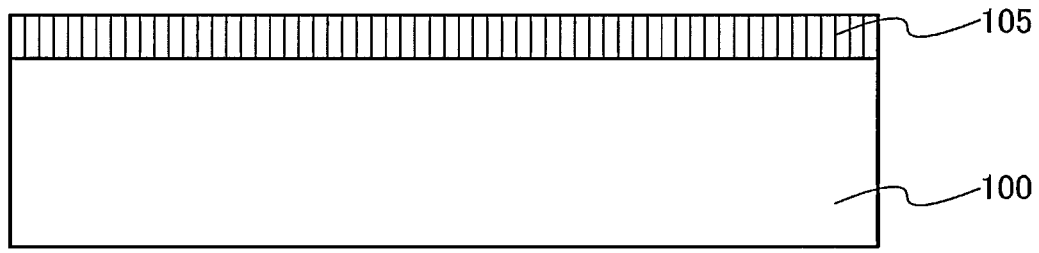

FIGS. 1A and 1B illustrate a method for forming an oxide semiconductor film according to one embodiment of the present invention. FIG. 1A illustrates a state in which an oxide semiconductor film 104 is formed over a substrate 100.

The oxide semiconductor film 104 is formed by sputtering or laser beam evaporation. When the oxide semiconductor film 104 is formed, as treatment before deposition, it is preferable to remove impurities such as hydrogen or moisture adsorbed in a deposition chamber and evacuate the deposition chamber, thereby preventing hydrogen or moisture from being contained in the film. In order to remove such impurities from the deposition chamber, an entrapment vacuum pump (such as a cryopump, an ion pump, or a titanium sublimation pump) is preferably used. As an exhaustion unit, a turbo molecular pump to which a cold trap is added may be used.

The oxide semiconductor film 104 is an oxide semiconductor film containing at least indium. The oxide semiconductor film 104 may contain zinc in addition to indium, for example.

The concentration of silicon in the oxide semiconductor film 104 is described below. In order to obtain stable electrical characteristics of a transistor including the oxide semiconductor film 104, it is effective to reduce the concentration of impurities in the oxide semiconductor film 104 so that the oxide semiconductor film 104 becomes intrinsic or substantially intrinsic. Specifically, the carrier density of the oxide semiconductor film is preferably set to lower than $1\times10^{17}/cm^3$, lower than $1\times10^{15}/cm^3$, or lower than $1\times10^{13}/cm^3$. In the oxide semiconductor film, a light element, a semimetal element, a metal element, and the like (lower than 1 atomic %), other than main components serve as impurities. For example, hydrogen, nitrogen, carbon, silicon, and germanium serve as impurities in the oxide semiconductor film.

Further, in the oxide semiconductor film 104, hydrogen and nitrogen generate a donor level, and increase the carrier density. The concentration of hydrogen in the oxide semiconductor film 104, which is measured by secondary ion mass spectrometry (SIMS), is set to lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, still further preferably lower than or equal to $5\times10^{18}$ atoms/cm$^3$. The concentration of nitrogen in the oxide semiconductor film 104, which is measured by SIMS, is set to lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Further, the concentration of alkali metal or alkaline earth metal of the oxide semiconductor film 104, which is measured by SIMS, is set to lower than or equal to $1\times10^{18}$ atoms/cm$^3$, preferably lower than or equal to $2\times10^{16}$ atoms/cm$^3$. This is because an alkali metal and an alkaline earth metal might generate carriers when bonded to an oxide semiconductor, in which case the off-state current of the transistor might be increased.

A transistor in which a highly purified oxide semiconductor film is used for a channel formation region as described above has an extremely small amount of off-state current, and the off-state current normalized with the channel width of the transistor can be as low as several yoctoamperes per micrometer to several zeptoamperes per micrometer.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of an amorphous oxide semiconductor film, a microcrystalline oxide semiconductor film, a polycrystalline oxide semiconductor film, a c-axis aligned crystalline oxide semiconductor (CAAC-OS) film, and the like.

The amorphous oxide semiconductor film has disordered atomic arrangement and no crystalline component. A typical example thereof is an oxide semiconductor film in which no crystal part exists even in a microscopic region, and the whole of the film is amorphous.

The microcrystalline oxide semiconductor film includes a microcrystal (also referred to as nanocrystal) with a size greater than or equal to 1 nm and less than 10 nm, for example. Thus, the microcrystalline oxide semiconductor film has a higher degree of atomic order than the amorphous oxide semiconductor film. Hence, the density of defect states of the microcrystalline oxide semiconductor film is lower than that of the amorphous oxide semiconductor film. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as a nc-OS (nanocrystalline oxide semiconductor) film.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film. The CAAC-OS film is described in detail below.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or a top surface of the CAAC-OS film, and is arranged in parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

From the results of the cross-sectional TEM image and the plan TEM image, alignment is found in the crystal parts in the CAAC-OS film.

A CAAC-OS film is subjected to structural analysis with an X-ray diffraction (XRD) apparatus. For example, when the CAAC-OS film including $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of $InGaZnO_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Further, when an impurity is added to the CAAC-OS film, the crystallinity in a region to which the impurity is added is changed, and the degree of crystallinity in the CAAC-OS film varies depending on regions.

Note that when the CAAC-OS film with an $InGaZnO_4$ crystal is analyzed by an out-of-plane method, a peak may also be observed at which 2θ is around 36°, in addition to the peak of 2θ at around 31°. The peak at which 2θ is around 36° indicates that a crystal having no c-axis alignment is included in part of the CAAC-OS film. It is preferable that in the CAAC-OS film, a peak of 2θ appears at around 31° and a peak of 2θ do not appear at around 36°.

With use of the CAAC-OS film in a transistor, variation in electrical characteristics of the transistor due to irradiation with visible light or ultraviolet light is small. Thus, the transistor has high reliability.

A nc-OS film is described in detail. In the nc-OS film, a microscopic region (e.g., a region with a size greater than or equal to 1 nm and less than or equal to 10 nm, in particular, a region with a size greater than or equal to 1 nm and less than or equal to 3 nm) has a periodic atomic order in some cases. Note that there is no regularity of atomic order between different crystal parts in the nc-OS film. Thus, there is no periodic atomic order even in the whole of the film. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a beam diameter larger than a diameter of a crystal part, a peak indicating a crystal plane does not appear. When the nc-OS film is subjected to electron diffraction using an electron beam with a beam diameter (e.g., 20 nmφ or more, or 50 nmφ or more) larger than a diameter of a crystal part, a halo pattern is observed in some cases. For example, spots are shown in some cases in an electron diffraction pattern (nanobeam electron diffraction pattern) of the nc-OS film obtained by using an electron beam having a diameter (e.g., 10 nmφ or less, or 3 nmφ or less) smaller than or equal to a diameter of a crystal part. In a nanobeam electron diffraction pattern of the nc-OS, for example, a region with high luminance in a circular pattern (ring shape) is shown in some cases. In a nanobeam electron diffraction pattern of the nc-OS film, for example, a plurality of spots are shown in the ring-shaped region in some cases.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of atomic order between different crystal parts in the nc-OS film. Hence, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

In this specification, a term "parallel" indicates that the angle formed between two straight lines is from −10° to 10°, and accordingly also includes a case where the angle is from −5° to 5°. In addition, a term "perpendicular" indicates that the angle formed between two straight lines is from 80° to 100°, and accordingly includes the case where the angle is from 85° to 95°.

In this specification, trigonal and rhombohedral crystal systems are included in a hexagonal crystal system.

Next, the oxide semiconductor film 104 is irradiated with an energy beam, thereby being heated. A typical example of the energy beam is a pulsed laser beam. The laser beam used for irradiation of the oxide semiconductor film 104 is preferably a pulsed laser beam. This is because a region irradiated with the laser beam can be instantaneously heated to a temperature which allows crystallization without causing thermal damage to the substrate over which the oxide semiconductor film 104 is formed.

It is preferable that the wavelength of laser beam used for heating the oxide semiconductor film 104 be a short wavelength having an energy higher than or equal to a band gap of the oxide semiconductor in order to absorb the laser beam in the oxide semiconductor film 104. An example of the light source of a laser beam having such a wavelength is an excimer laser. As the excimer laser, XeCl (308 nm), KrF (248 nm), ArF (193 nm), or the like can be used. The third harmonic of a YAG laser or the like may be used.

Note that the laser beam emitted to the oxide semiconductor film 104 does not need to be completely absorbed in the oxide semiconductor film 104. When the oxide semiconductor film 104 is irradiated with the laser beam, the oxide semiconductor film 104 is heated to a high temperature. If the laser beam is not absorbed in the oxide semiconductor film 104 and reaches the base surface or the base film, it may be absorbed in and heat the base surface or the base film. In any case, the oxide semiconductor film 104 is instantaneously heated to a very high temperature (melting point or a temperature close to the melting point). In the case where the base surface (substrate 100) of the oxide semiconductor film 104 is formed using a material having a melting point higher than the temperature to which the oxide semiconductor film 104 is heated, the material of the base surface (substrate 100) of the oxide semiconductor film 104 is not melted, which prevents contamination of the oxide semiconductor with the material of the base.

The oxide semiconductor film 104 is heated by being irradiated with an energy beam, whereby a non-single-crystal oxide semiconductor film 105 including a crystal region can be obtained (see FIG. 1B).

Crystal structures of a nc-OS film irradiated with a laser beam and a CAAC-OS film irradiated with a laser beam were evaluated.

First, samples were formed. As oxide semiconductor films, a 35-nm-thick nc-OS film and a 35-nm-thick CAAC-OS film were formed using an In—Ga—Zn target where an atomic ratio of In, Ga, and Zn was 1:1:1 over a quartz substrate, and were irradiated with a laser beam.

The In—Ga—Zn oxide of the nc-OS film was formed under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at room temperature (25° C.).

On the other hand, the In—Ga—Zn oxide of the CAAC-OS film was formed under the following conditions: a sputtering target having an atomic ratio of In:Ga:Zn=1:1:1 was used; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. Note that the substrate temperature in the deposition of the In—Ga—Zn oxide film was set at 300° C.

For laser treatment, an XeCl excimer laser (Lambda STEEL 2000) with a wavelength λ of 308 nm and a pulse width of 25 nsec (full width at half maximum) was used. The laser beam was made in a linear shape, and the substrate was scanned in a direction perpendicular to the longitudinal axis of the linear beam while being sprayed with $N_2$ at the room temperature (25° C.) so that the nc-OS film and the CAAC-OS film were irradiated with the linear laser beam. The scanning was performed at 1 mm/sec under such conditions that the beam width of the linear beam was about 320 μm and the repetition rate was 30 Hz; the number of shots of the laser beam with which one portion was irradiated was about 10.

Next, evaluation of crystallinity was conducted by an out-of-plane method using XRD as evaluation of a crystal structure.

Figure 2A:
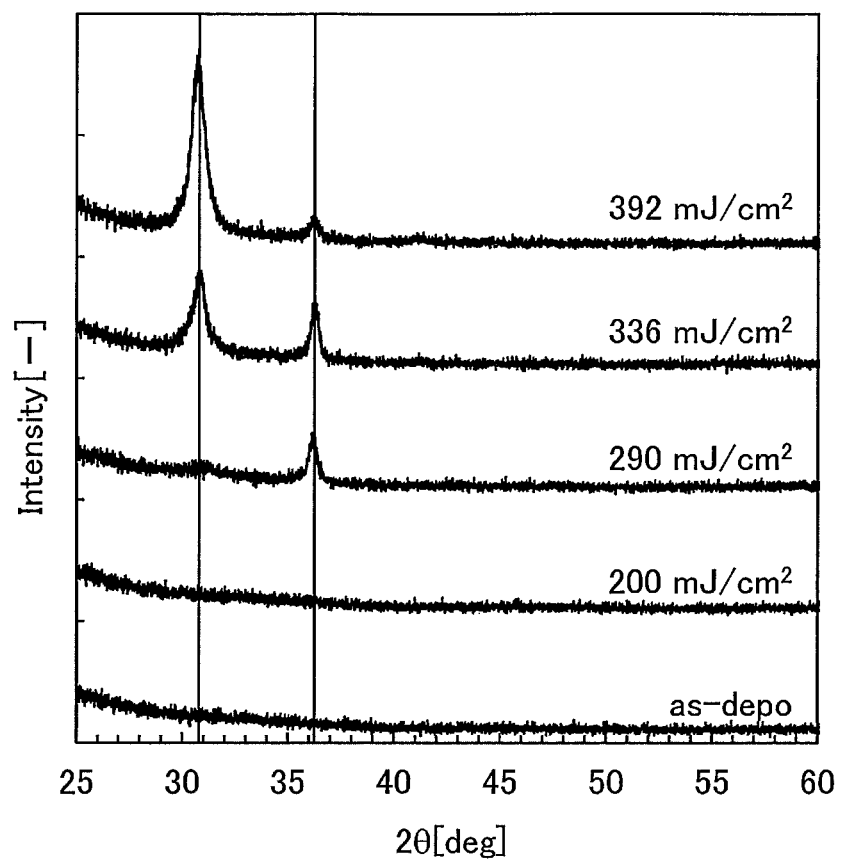
FIGS. 2A and 2B are graphs showing XRD results.
Figure 2B:
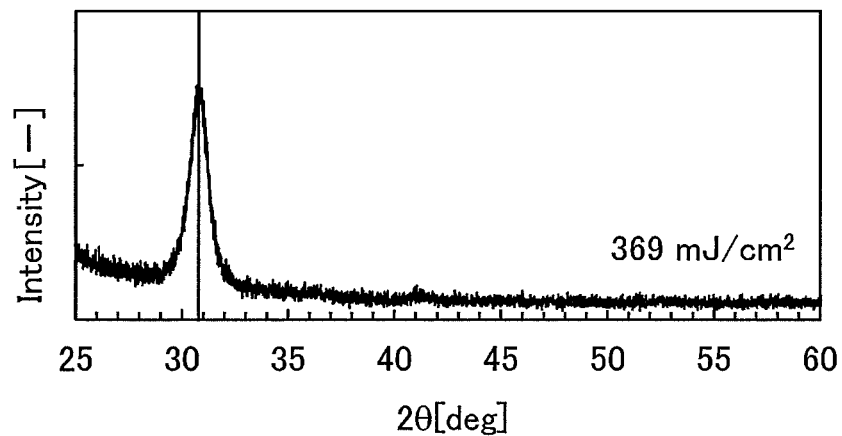

FIGS. 2A and 2B show laser energy density dependence of XRD patterns obtained by an out-of-plane method. FIG. 2A is a graph showing XRD patterns of the nc-OS film, and FIG. 2B is a graph showing an XRD pattern of the CAAC-OS film.

As shown in FIG. 2A, peaks appeared at 2θ around 31° and 36° in the nc-OS film when the laser energy density was higher than or equal to 290 mJ/cm². Further, as shown in FIG. 2B, only a peak at 2θ around 31° appeared in the CAAC-OS film. In order to verify that the peak at around 36° (2θ) was reflected by a crystal structure unique to the nc-OS film crystallized with a laser, a cross-sectional TEM image of the nc-OS film was observed and energy dispersive X-ray spectrometry (EDX) analysis was performed.

Figure 3A:
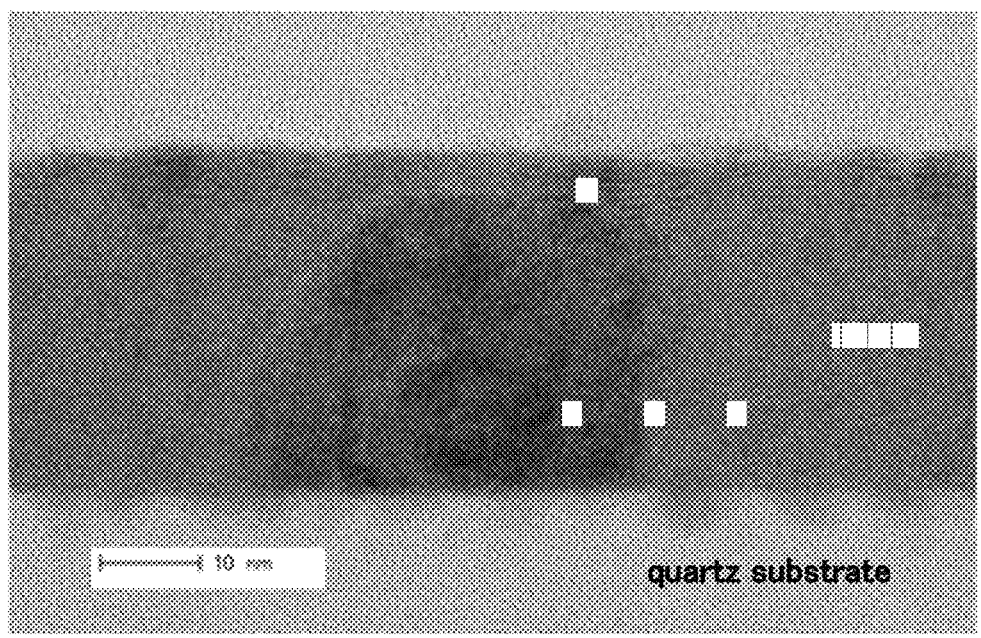
FIGS. 3A and 3B are a cross-sectional TEM image and a graph showing EDX peaks.
Figure 3B:
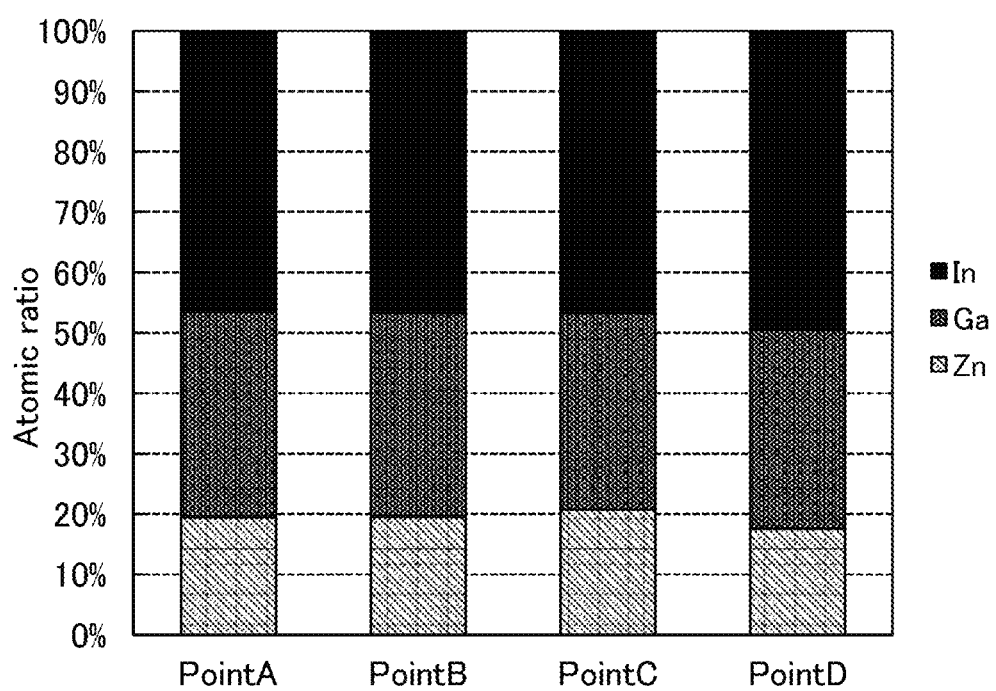

FIG. 3A is a cross-sectional TEM image, and FIG. 3B shows results of EDX analysis.

In the cross-sectional TEM image of FIG. 3A, lattice images are observed in the nc-OS film, and a cycle of the lattice image in the vicinity of surface layer (Point A in the image) and cycles of the lattice images inside the film (Points B, C, and D in the image) are different. Further, according to FIG. 3B, there is little difference in the nc-OS film between the composition in the vicinity of the surface layer and the composition inside the film.

Figure 4A:
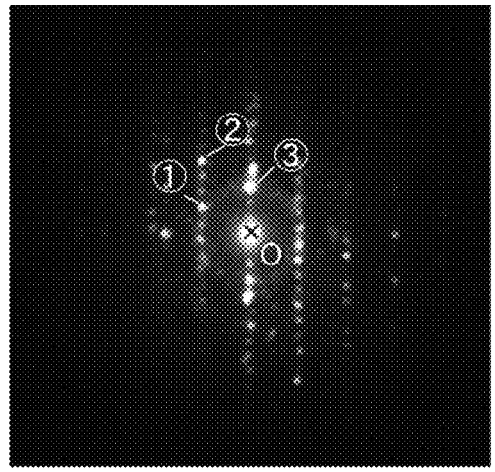
FIGS. 4A to 4C show nanobeam electron diffraction patterns.
Figure 4B:
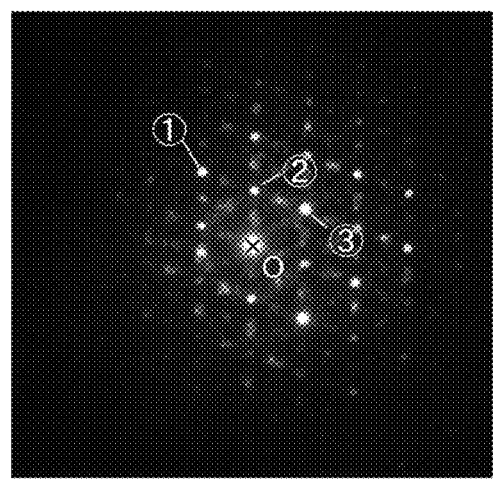
Figure 4C:
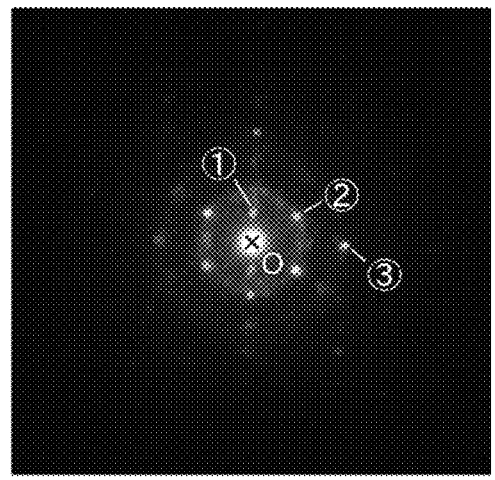

FIGS. 4A to 4C show electron diffraction patterns in the vicinity of the surface layer and the inside of the nc-OS film, which were measured by nanobeam electron diffraction.

FIG. 4A shows the electron diffraction pattern in the vicinity of the surface layer of the nc-OS film, and FIGS. 4B and 4C show the electron diffraction patterns inside the nc-OS film.

The lattice spacings d in a luminescent spot 1, a luminescent spot 2, and a luminescent spot 3 in FIG. 4A are 0.249 nm, 0.156 nm, and 0.290 nm, respectively. The angle formed by the luminescent spot 1, a luminescent spot O, and the luminescent spot 2 is 27.8°, the angle formed by the luminescent spot 1, the luminescent spot O, and the luminescent spot 3 is 61.6°, and the angle formed by the luminescent spot 2, the luminescent spot O, and the luminescent spot 3 is 33.8°. The above nanobeam electron diffraction pattern was compared with data of JCPDS, and it was found that the pattern was substantially equal to that of $InGaZnO_4$ (JCPDS No. 38-1104 where the lattice spacings d in a luminescent spot 1, a luminescent spot 2, and a luminescent spot 3 are respectively 0.250 nm, 0.156 nm, and 0.290 nm, the angle formed by the luminescent spot 1, a luminescent spot O, and the luminescent spot 2 is 28.2°, the angle formed by the luminescent spot 1, the luminescent spot O, and the luminescent spot 3 is 61.3°, and the angle formed by the luminescent spot 2, the luminescent spot O, and the luminescent spot 3 is 33.1°).

The lattice spacings d in a luminescent spot 1, a luminescent spot 2, and a luminescent spot 3 in FIG. 4B are 0.152 nm, 0.247 nm, and 0.216 nm, respectively. The angle formed by the luminescent spot 1, a luminescent spot O, and the luminescent spot 2 is 35.5°, the angle formed by the luminescent spot 1, the luminescent spot O, and the luminescent spot 3 is 89.4°, and the angle formed by the luminescent spot 2, the luminescent spot O, and the luminescent spot 3 is 53.9°. The above nanobeam electron diffraction pattern was compared with data of JCPDS, and it was found that the pattern was substantially equal to that of $ZnGa_2O_4$ (JCPDS No. 38-1240 where the lattice spacings d in a luminescent spot 1, a luminescent spot 2, and a luminescent spot 3 are respectively 0.147 nm, 0.240 nm, and 0.208 nm, the angle formed by the luminescent spot 1, a luminescent spot O, and the luminescent spot 2 is 35.3°, the angle formed by the luminescent spot 1, the luminescent spot O, and the luminescent spot 3 is 90.0°, and the angle formed by the luminescent spot 2, the luminescent spot O, and the luminescent spot 3 is 54.7°).

The lattice spacings d in a luminescent spot 1, a luminescent spot 2, and a luminescent spot 3 in FIG. 4C are 0.494 nm, 0.256 nm, and 0.150 nm, respectively. The angle formed by the luminescent spot 1, a luminescent spot O, and the luminescent spot 2 is 58.6°, the angle formed by the luminescent spot 1, the luminescent spot O, and the luminescent spot 3 is 90.0°, and the angle formed by the luminescent spot 2, the luminescent spot O, and the luminescent spot 3 is 31.4°. The above nanobeam electron diffraction pattern was compared with data of JCPDS, and it was found that the pattern was substantially equal to that of $ZnGa_2O_4$ (JCPDS No. 38-1240 where the lattice spacings d of a luminescent spot 1, a luminescent spot 2, and a luminescent spot 3 are respectively 0.481 nm, 0.251 nm, and 0.147 nm, the angle formed by the luminescent spot 1, a luminescent spot O, and the luminescent spot 2 is 58.5°, the angle formed by the luminescent spot 1, the luminescent spot O, and the luminescent spot 3 is 90.0°, and the angle formed by the luminescent spot 2, the luminescent spot O, and the luminescent spot 3 is 31.5°).

In addition, according to the EDX analysis results in that there is little difference between the composition of the surface layer and the composition of the inside of the nc-OS film, the inside of the film have such a structure that In is contained in $ZnGa_2O_4$. Thus, the inside of the film is crystallized as $ZnIn_xGa_{(2-x)}O_4$ with a spinel structure.

Therefore, from the evaluation results of the crystal structure obtained by irradiating the nc-OS film with the laser beam, it was found that the peak appearing at 2θ that was around 36° in the XRD diffraction pattern by out-of-plane was attributed to spinel. The nc-OS film has such a crystal structure that the surface layer has a homologous structure, and the inside of the film has a spinel structure.

In addition, the surface layer of the nc-OS film irradiated with the laser beam is removed by etching or the like, whereby the inside of the film is exposed; $ZnInGaO_4$ with a spinel structure can be obtained. Thus, the crystallinity of the oxide semiconductor can be improved, and the electric characteristics of the transistor can be improved.

Figure 5A:
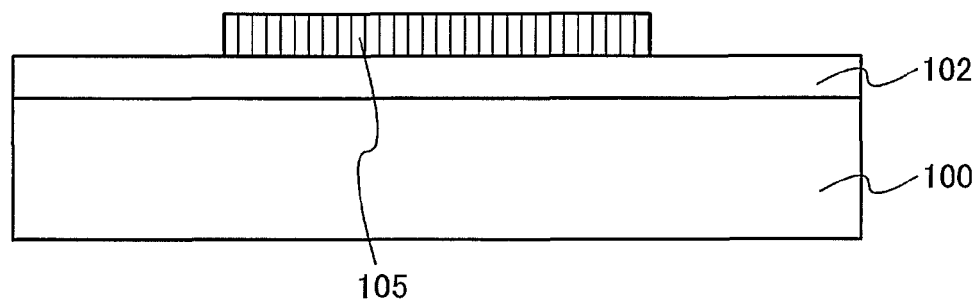
FIGS. 5A to 5C illustrate a method for manufacturing a top-gate transistor.
Figure 5B:
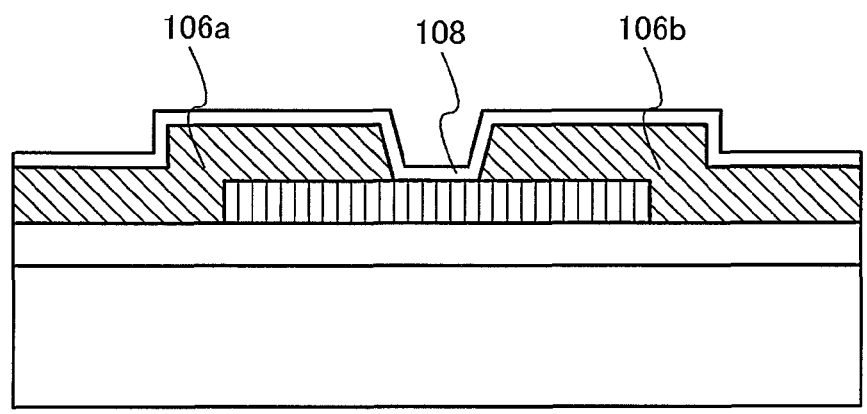
Figure 5C:
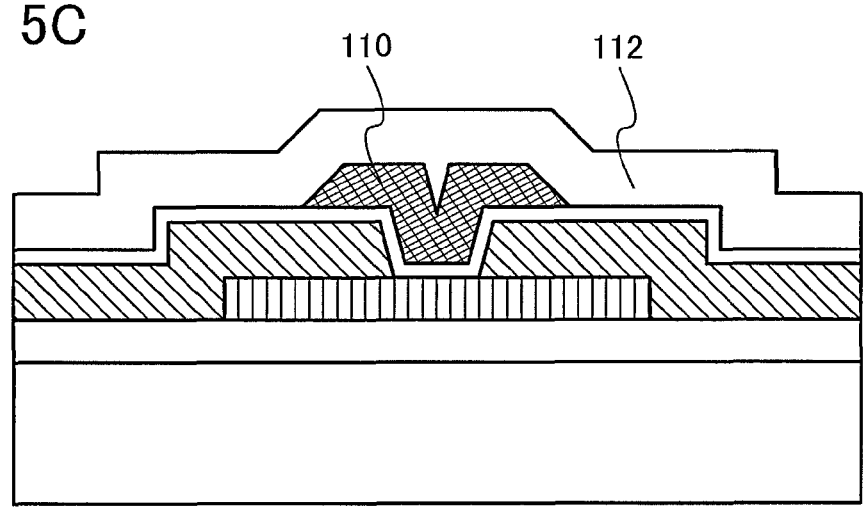

Next, a method for manufacturing a semiconductor device using the oxide semiconductor film 105 will be described with reference to FIGS. 5A to 5C. FIGS. 5A to 5C illustrate manufacturing steps of a transistor which is an element of the semiconductor device. The transistor illustrated in FIGS. 5A to 5C is an example of a top-gate transistor.

First, a base insulating film 102 and the oxide semiconductor film 105 are formed over the substrate 100 (see FIG. 5A). The oxide semiconductor film 105 is similar to that illustrated in FIG. 1B. The oxide semiconductor film 105 may be processed into an island shape by etching in accordance with the shape of the transistor.

There is no large limitation on the substrate 100. For example, a glass substrate, a ceramic substrate, a quartz substrate, or a sapphire substrate may be used as the substrate 100. Alternatively, a single crystal semiconductor substrate or a polycrystalline semiconductor substrate made of silicon, silicon carbide, or the like, a compound semiconductor substrate made of silicon germanium or the like, a silicon-on-insulator (SOI) substrate, or the like may be used as the substrate 100. Still alternatively, any of these substrates provided with a semiconductor element may be used as the substrate 100.

In the case of using a large glass substrate such as the fifth generation (1000 mm×1200 mm or 1300 mm×1500 mm); the sixth generation (1500 mm×1800 mm); the seventh generation (1870 mm×2200 mm); the eighth generation (2200 mm×2500 mm); the ninth generation (2400 mm×2800 mm); or the tenth generation (2880 mm×3130 mm) as the substrate 100, in some cases, microfabrication is difficult due to the shrinkage of the substrate 100, which is caused by heat treatment or the like in a manufacturing process of the semiconductor device. Therefore, in the case where the above-described large glass substrate is used as the substrate 100, a substrate which is unlikely to shrink through the heat treatment is preferably used. For example, as the substrate 100, it is possible to use a large glass substrate in which the amount of shrinkage after heat treatment which is performed for an hour at 400° C., preferably 450° C., further preferably 500° C. is less than or equal to 10 ppm, preferably less than or equal to 5 ppm, further preferably less than or equal to 3 ppm.

Still alternatively, a flexible substrate may be used as the substrate 100. As a method of providing a transistor over a flexible substrate, there is a method in which a transistor is formed over a non-flexible substrate, and then the transistor is separated and transferred to the substrate 100 which is a flexible substrate. In that case, a separation layer is preferably provided between the non-flexible substrate and the transistor.

The base insulating film 102, from which oxygen is released by heat treatment, has a function of supplying the oxygen to the oxide semiconductor film as well as a function of preventing diffusion of an impurity from the substrate 100; thus, the base insulating film 102 is preferably an insulating film containing oxygen, further preferably an insulating film containing excess oxygen. Note that in the case where the substrate 100 is a substrate where another device is formed as described above, the base insulating film 102 has also a function as an interlayer insulating film. In that case, the base insulating film 102 is preferably subjected to planarization treatment such as chemical mechanical polishing (CMP) treatment so as to have a flat surface.

As the base insulating film 102, for example, a single layer selected from a silicon oxide film, a gallium oxide film, a zinc oxide film, an aluminum oxide film, a gallium zinc oxide film, a silicon nitride film, a silicon oxynitride film, an aluminum oxynitride film, and a silicon nitride oxide film or a stack of any of these films can be used.

Here, a film from which oxygen is released by heat treatment may release oxygen, the amount of which is higher than or equal to $1\times10^{18}$ atoms/cm$^3$, higher than or equal to $1\times10^{19}$ atoms/cm$^3$, or higher than or equal to $1\times10^{20}$ atoms/cm$^3$ in TDS analysis in which heat treatment is performed such that a temperature of a film surface is higher than or equal to 100° C. and lower than or equal to 700° C., preferably higher than or equal to 100° C. and lower than or equal to 500° C. (converted into the number of oxygen atoms).

The film from which oxygen is released by heat treatment may contain a peroxide radical. Specifically, the spin density attributed to the peroxide radical is higher than or equal to $5\times10^{17}$ spins/cm$^3$. Note that "a film containing a peroxide radical" refers to "a film having a signal having asymmetry at a g value of around 2.01 in electron spin resonance (ESR)".

The insulating film containing excess oxygen may be oxygen-excess silicon oxide ($SiO_X(X>2)$). In the oxygen-excess silicon oxide ($SiO_X(X>2)$), the number of oxygen atoms per unit volume is more than twice the number of silicon atoms per unit volume. The number of silicon atoms and the number of oxygen atoms per unit volume are measured by Rutherford backscattering spectrometry (RBS).

Next, a source electrode 106a and a drain electrode 106b which are in contact with the oxide semiconductor film 105 are formed, and a gate insulating film 108 is formed over the oxide semiconductor film 105, the source electrode 106a, and the drain electrode 106b (see FIG. 5B).

The source electrode 106a and the drain electrode 106b are formed by a sputtering method, a CVD method, an evaporation method, or the like.

The source electrode 106a and the drain electrode 106b can be formed to have a single-layer structure or a stacked structure using any of single metals such as aluminum, titanium, chromium, nickel, copper, yttrium, zirconium, molybdenum, silver, tantalum, and tungsten, or an alloy containing any of these single metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

The gate insulating film 108 can be formed using a silicon oxide film, a gallium oxide film, an aluminum oxide film, a silicon nitride film, a silicon oxynitride film, an aluminum oxynitride film, or a silicon nitride oxide film. It is preferable that the gate insulating film 108 contain oxygen in a portion which is in contact with the oxide semiconductor film 105. The gate insulating film 108 preferably contains a large amount of oxygen which exceeds at least the stoichiometric proportion in (a bulk of) the film; for example, in the case where a silicon oxide film is used as the gate insulating film 108, the composition formula is $SiO_{2+\alpha}$ ($\alpha>0$). Similarly, in the case where aluminum oxide is used, the composition formula is $Al_2O_{3+\alpha}$ ($\alpha>0$).

The gate insulating film 108 can be formed using a high-k material such as hafnium oxide, yttrium oxide, hafnium silicate ($HfSi_xO_y(x>0, y>0)$), hafnium silicate to which nitrogen is added ($HfSiO_xN_y(x>0, y>0)$), hafnium aluminate ($HfAl_xO_y(x>0, y>0)$), or lanthanum oxide, magnesium oxide, zinc oxide-magnesium oxide solid solution, whereby gate leakage current can be reduced. Further, the gate insulating film 108 may have either a single-layer structure or a stacked structure.

The gate insulating film 108 has a thickness greater than or equal to 1 nm and less than or equal to 100 nm and can be formed by a sputtering method, an MBE method, a CVD method, a pulse laser deposition method, an ALD method, or the like as appropriate. The gate insulating film 108 may also be formed with a sputtering apparatus which performs film deposition with surfaces of a plurality of substrates set substantially perpendicular to a surface of a sputtering target.

Next, a gate electrode 110 is formed over the gate insulating film 108, and a passivation film 112 is formed over the gate insulating film 108 and the gate electrode 110 (see FIG. 5C).

The gate electrode 110 can be formed using: a metal material such as molybdenum, titanium, tantalum, tungsten, aluminum, copper, chromium, neodymium, or scandium; an alloy material which includes any of these materials as a main component; polycrystalline silicon doped with an impurity element such as phosphorus; silicide such as nickel silicide; indium tin oxide; indium oxide containing tungsten oxide; indium zinc oxide containing tungsten oxide; indium oxide containing titanium oxide; indium tin oxide containing titanium oxide; indium zinc oxide; indium tin oxide to which silicon oxide is added; or a metal oxide containing nitrogen, specifically an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film. If the gate electrode 110 is made of a material having a work function of 5 eV or higher, preferably 5.5 eV or higher, the transistor can have a positive threshold voltage, whereby a so-called normally-off transistor can be obtained.

The passivation film 112 is preferably formed using a material that includes a Group 13 element the same group as one of the elements included in the oxide semiconductor film 105, or a Group 3 element having properties similar to those of a Group 13 element. With such a passivation film, the oxide semiconductor film 105 can be prevented from being contaminated with a different kind of element while heat resistance can be held. Aluminum oxide is one of the preferred materials of the passivation film 112, which is suitable because of its high barrier properties against hydrogen and moisture.

Heat treatment may be performed before or after the passivation film 112 is formed. The heat treatment is preferably performed in an oxygen atmosphere or a dry air atmosphere (with a water content of 20 ppm or less, preferably 1 ppm or less, and further preferably 10 ppb or less), and the heating temperature may be higher than or equal to 100° C. and lower than or equal to 700° C., preferably higher than or equal to 200° C. and lower than or equal to 400° C. This treatment is expected to allow oxygen to be supplied to the oxide semiconductor film 105 from the insulating films (the base insulating film 102, the gate insulating film 108, and the passivation film 112) in contact with the oxide semiconductor film 105, which leads to reduction in oxygen deficiency.

When the transistor is manufactured in such a manner, the crystallinity is improved particularly in the channel formation region of the oxide semiconductor film 105, so that high field-effect mobility can be obtained. That is, a crystalline region exists in close contact with the metal oxide film, so that suppressed variation in threshold voltage as well as a reduction in the density of interface states and an increase in field-effect mobility can be expected. Similarly to a silicon integrated circuit, a top-gate transistor can be manufactured by a planar process (a process in which an element and a terminal electrode of the element are formed over the same plane surface), which is advantageous in miniaturization of the transistor. Accordingly, the transistor can be used not only for a pixel matrix of a display panel, but also for a memory and logic circuit.

Figure 6A:
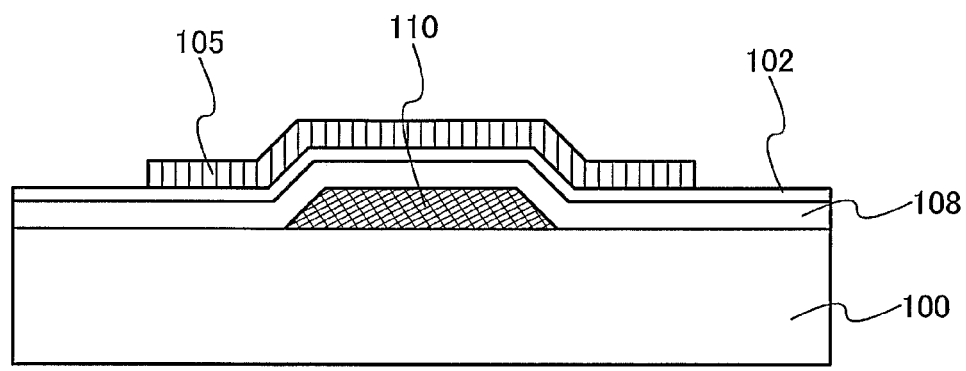
FIGS. 6A and 6B illustrate a method for manufacturing a bottom-gate transistor.
Figure 6B:
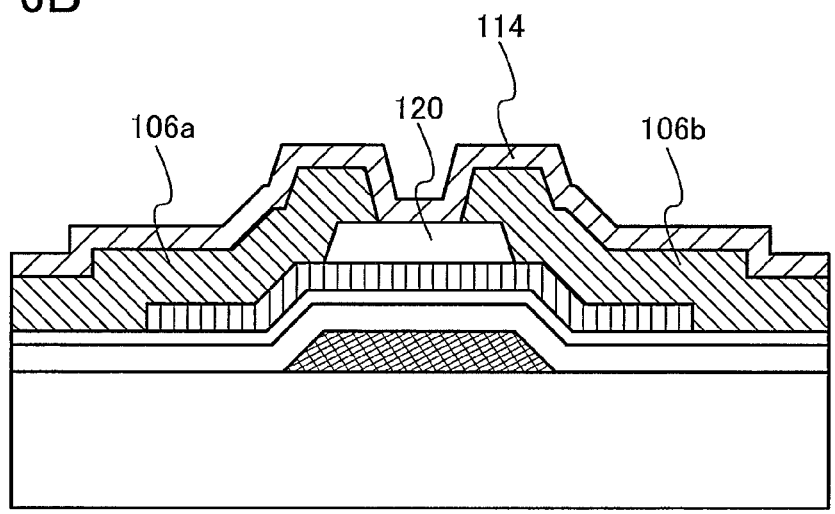

Next, a method for manufacturing a semiconductor device using the non-single-crystal oxide semiconductor film 105, which is different from that illustrated in FIGS. 5A to 5C, will be described with reference to FIGS. 6A and 6B. In FIGS. 6A and 6B, a bottom-gate transistor is illustrated as an example.

In the bottom-gate transistor, the gate electrode 110, the gate insulating film 108, and the oxide semiconductor film 105 are formed in order over the substrate 100 (see FIG. 6A). A layer corresponding to the base insulating film 102 is provided between the gate insulating film 108 and the oxide semiconductor film 105. The base insulating film 102 has an effect similar to that described with reference to FIGS. 5A to 5C. Note that the insulating film 102 is not necessarily provided.

Next, the source electrode 106a and the drain electrode 106b are formed over the oxide semiconductor film 105 (see FIG. 6B). Furthermore, as illustrated in FIG. 6B, an insulating film 120 serving as a channel protective film may be provided so as to substantially overlap a region (a channel formation region) of the oxide semiconductor film 105, which overlaps the gate electrode 110. Since the insulating film 120 is in contact with the oxide semiconductor film 105, it is preferably made of the same kind of insulating material as the base insulating film 102.

A passivation film 114 is provided over the source electrode 106a and the drain electrode 106b so as to cover the oxide semiconductor film 105, and formed using a material containing a Group 13 element that is the same group as one of the elements included in the oxide semiconductor film 105, or a Group 3 element having properties similar to those of the Group 13 element, whereby contamination of the oxide semiconductor film 105 with a different kind of element can be prevented while heat resistance is maintained. Aluminum oxide is one of the preferable materials of the passivation film 114, which is suitable because of its high barrier properties against hydrogen and moisture. Further, before or after the passivation film 114 is formed, heat treatment may be performed in an oxygen atmosphere or a dry air atmosphere (with a water content of 20 ppm or less, preferably 1 ppm or less, and further preferably 10 ppb or less).

When the transistor is manufactured in such a manner, the crystallinity is improved particularly in the channel formation region of the oxide semiconductor film 105, so that high field-effect mobility can be obtained. That is, a crystalline region exists in close contact with the metal oxide film, so that suppressed variation in threshold voltage as well as a reduction in density of interface states and an increase in field-effect mobility can be expected.

EXAMPLE 1

In Example 1, the attribution of a peak appearing at which 2θ was around 36° in crystallinity evaluation by an out-of-plane method using XRD was examined in detail.

Supposed planes to which a peak appearing at around 36° (2θ) is attributed are a (311) plane (2θ=35.7°) and a (222) plane (2θ=37.3°) in the case of an XRD pattern of $ZnGa_2O_4$ crystal with a spinel structure.

In order to cause a shift to a high-angle side in the (311) plane (2θ=35.7°), the lattice spacing needs to be narrowed. It is necessary for narrowing the lattice spacing to apply a high pressure. Thus, it is unlikely that the (311) plane is a plane having a peak at which 2θ is around 36°. On the other hand, when a Ga site in the $ZnGa_2O_4$ crystal is replaced with In, the lattice spacing on the (222) plane (2θ=37.3°) is expanded by In, and a shift to a low-angle side is caused. Thus, it is highly likely that the (222) plane is a plane having a peak at which 2θ is around 36°.

Cation radii of In hexacoordinate, Ga hexacoordinate, and Zn tetracoordinate (see R. D, Shanon, Acta Crystallogr., A32 751-767 (1976)) are compared, and it is found that $In^{3+}$ is 94 pm, $Ga^{3+}$ is 76 pm, and $Zn^{2+}$ is 74 pm. In the case of trivalent cation, $In^{3+}>Ga^{3+}$; accordingly, when a Ga site in the $ZnGa_2O_4$ structure is replaced with In, the lattice spacing could increase.

Thus, a structure of $ZnIn_xGa_{(2-x)}O_4$ that was obtained by replacing a Ga site of spinel $ZnGa_2O_4$ with In was calculated by first-principles calculation, and the calculation of XRD patterns were conducted. The conditions are as follows.

<Description of First-Principles Calculation>

For calculation, a first-principles electronic structure calculation program "CASTEP" using density functional theory (DFT) was used. As an exchange-correlation functional, GGA-PEBsol which has an advantage in reproducibility of the lattice parameter was used. On-the-fly pseudo potential was used, and the cut-off energy of a plane wave was 800 eV. The structure optimization was conducted on each composition on the basis of the $ZnGa_2O_4$ crystal containing 56 atoms per unit cell. The k-point grid was 2×2×2. On the lattice parameter, the following bounds are imposed; a=b=c and α=β=Γ=90°.

The convergence conditions of the structure were as follows: the maximum value of force applied per atom was 0.1 eV/nm, the amount of energy change in system was $5.0 \times 10^{-5}$ eV/nm, the pressure applied per unit cell was 0.02 GPa, the maximum displacement of atom was $5.0 \times 10^{-3}$ nm or less.

The accuracy of the lattice parameter obtained by the calculation was compared with $ZnGa_2O_4$ whose actual measured values existed. The shaft length of $ZnGa_2O_4$ that was actually measured was 0.83342(3) nm (M. Wendschuh-Josties et. al., Neues Jahrbuch fuer Mineralogie. Monatshefte (Band=Jahr) (1950-) (1995) 1995, (6) pp. 273-280). Meanwhile, the shaft length of $ZnIn_xGa_{(2-x)}O_4$ calculated by the CASTEP was 0.8351 nm, which means that $ZnIn_xGa_{(2-x)}O_4$ has accuracy sufficient for the lattice parameter used for XRD pattern calculation.

As a structure of $ZnIn_xGa_{(2-x)}O_4$ obtained by replacement with In, a composition of In:Ga:Zn=1:3:2 (atomic ratio) and a composition of In:Ga:Zn=1:1:1 (atomic ratio) were employed for the evaluation. Arrangement in the structure where a Ga site of $ZnGa_2O_4$ was partly replaced with In was examined so that the energy of system was stabilized, and a structure where the energy of system was stable was employed.

<Description of XRD Pattern Calculation>

For calculation, RIETAN-FP (ref. F. Izumi and K. Momma, "Three-dimensional visualization in powder diffraction," Solid State Phenom., 130, 15-20 (2007)) was used. An X-ray source used for the calculation of XRD patterns was a Cu-Kα ray.

Calculation results are shown in Table 1.

TABLE 1

| x | Formula | lattice parameter a [nm] | 2 θ [deg.] {311} | {222} |
|---|---|---|---|---|
| 0 | $ZnGa_2O_4$ | 0.835 | 35.63 | 37.27 |
| 0.5 | $In_{0.5}Ga_{1.5}ZnO_4$ | 0.849 | 35.01 | 36.62 |
| 1 | $InGaZnO_4$ | 0.864 | 34.49 | 35.98 |

According to Table 1, as the proportion of In in $ZnIn_xGa_{(2-x)}O_4$ increases, the lattice parameter is increased. The lattice parameters and the XRD diffraction peak angles (2θ) on the (222) plane were as follows: 0.849 nm and 36.62° when x=0.5 ($In_{0.5}Ga_{1.5}ZnO_4$ (spinel structure)); 0.864 nm and 35.98° when x=1 ($InGaZnO_4$ (spinel structure)).

The lattice parameters in the spinel structures and the peaks 2θ of the XRD patterns estimated by nanobeam electron diffraction were, respectively, about 0.849 nm to 0.864 nm and around 36°, which substantially corresponds to the calculation results of the composition where x=0.5 to 1.

The above results suggest the possibility that the peak appearing at which 2θ was around 36° in the XRD pattern is attributed to $ZnIn_xGa_{(2-x)}O_4$ (x=0.5 to 1) with a spinel structure.

EXAMPLE 2

In Example 2, atomic arrangement in cross sections of a surface layer and an inside of a nc-OS film irradiated with a laser beam was observed with a high-angle annular dark field scanning transmission electron microscopy (HAADF-STEM) and evaluated. A Hitachi scanning transmission electron microscope HD-2700 was used for the HAADF-STEM.

Figure 7A:
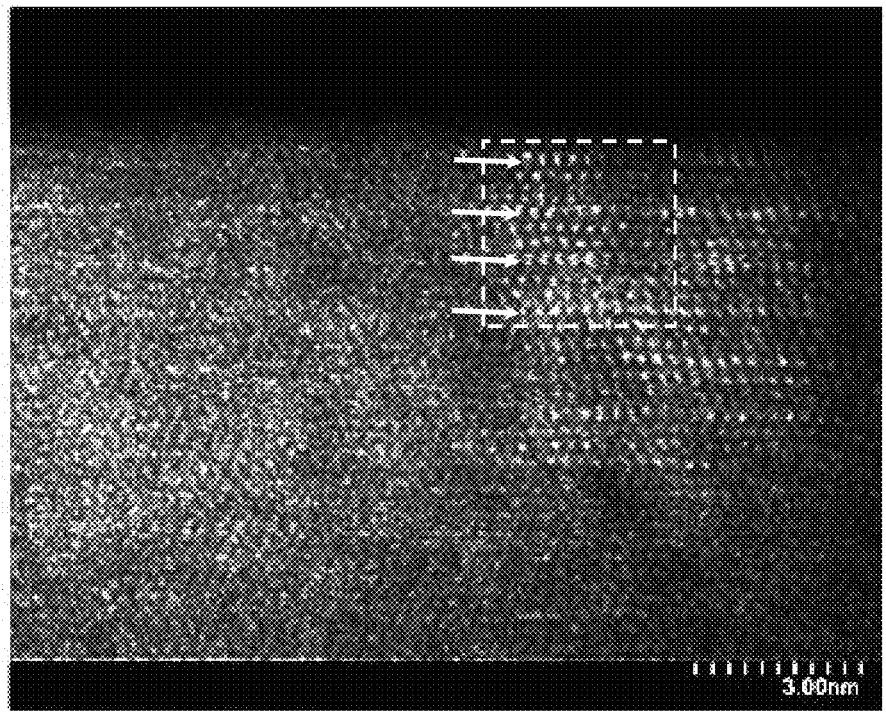
FIGS. 7A and 7B are cross-sectional HAADF-STEM images of a film surface of a sample that is an nc-OS film irradiated with laser.
Figure 7B:
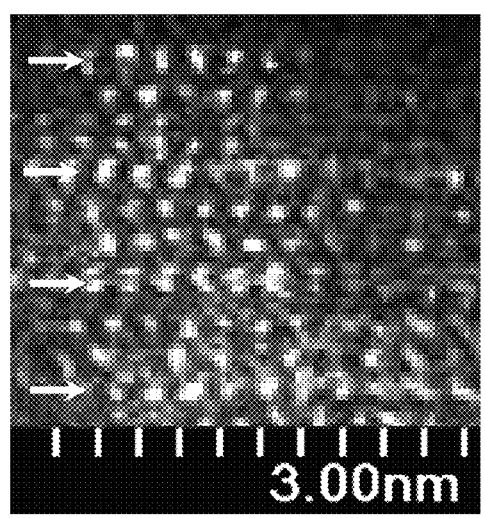
Figure 7C:
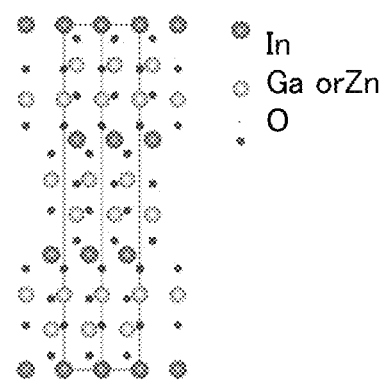
FIG. 7C is a diagram describing a surface structure of the sample.

FIGS. 7A to 7C show atomic arrangement in a cross section of the surface layer of the nc-OS film. Note that FIG. 7A is a HAADF-STEM image, FIG. 7B is an enlarged view of a surrounded portion in FIG. 7A, and FIG. 7C shows a crystal structure model of $InGaZnO_4$.

Figure 8A:
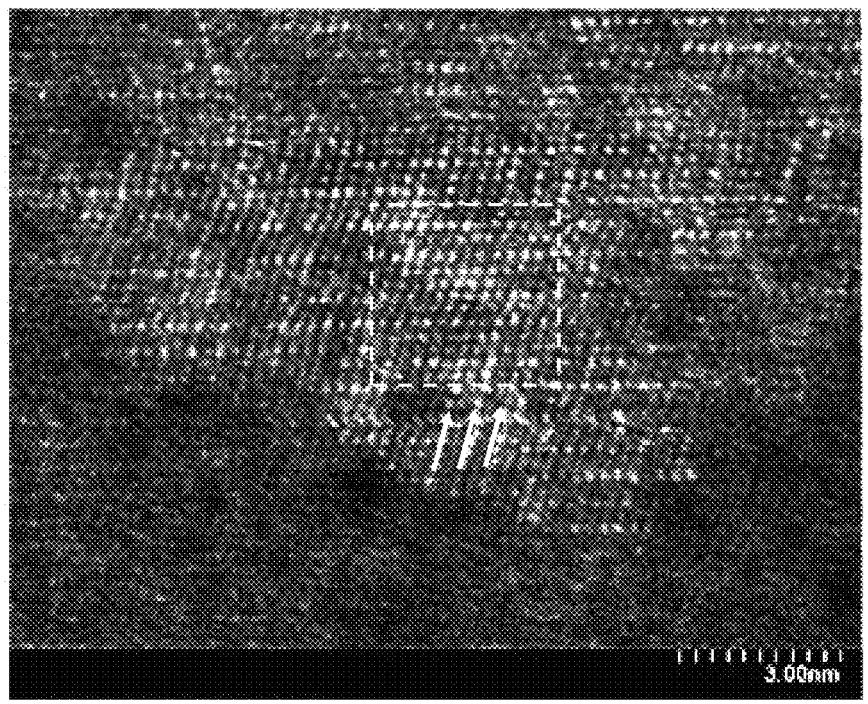
FIGS. 8A and 8B are cross-sectional HAADF-STEM images of an inside of a sample that is an nc-OS film irradiated with laser.
Figure 8B:
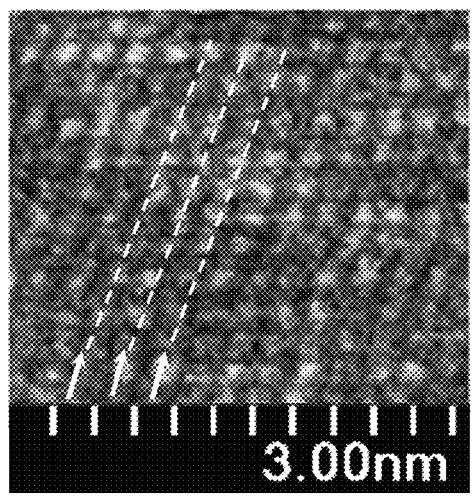
Figure 8C:
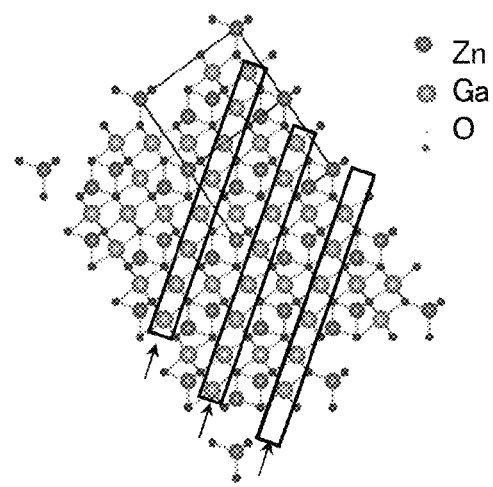
FIG. 8C is a diagram describing a structure of an inside of the sample.
Figure 9A:
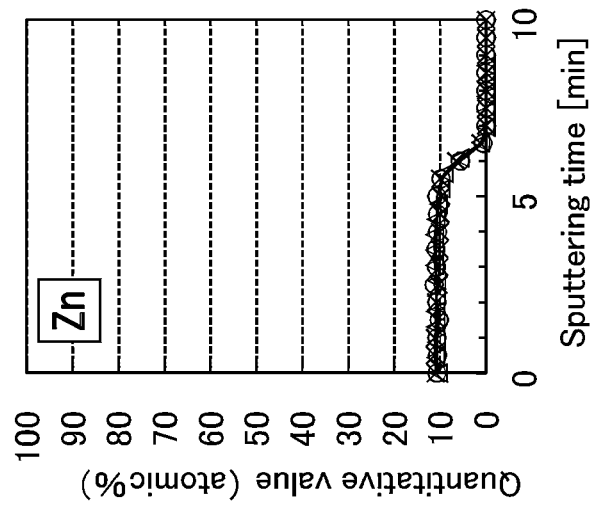
FIGS. 9A to 9C are graphs showing XPS analysis results.
Figure 9B:
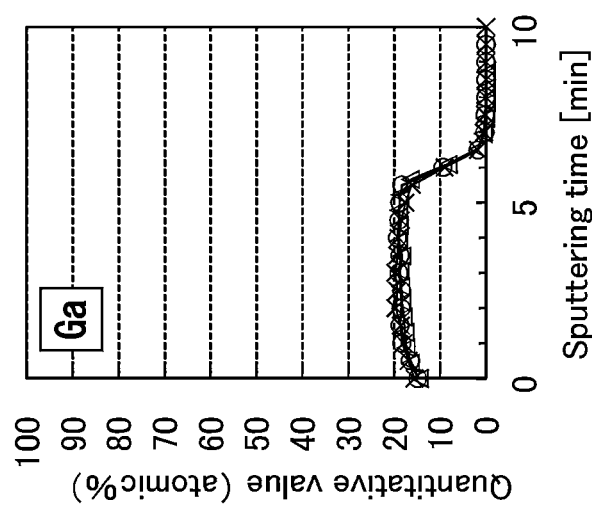
Figure 9C:
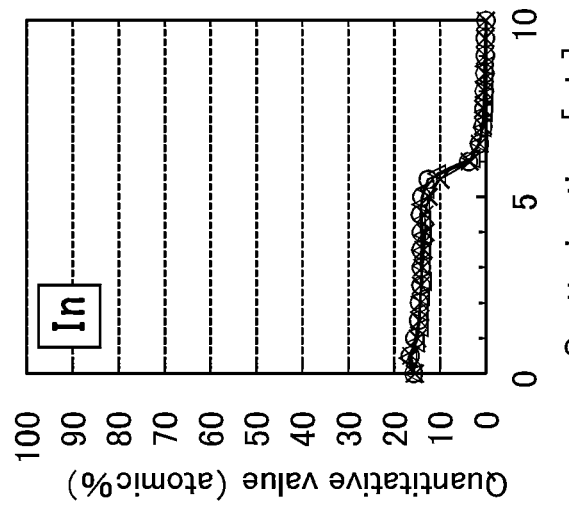
Figure 10A:
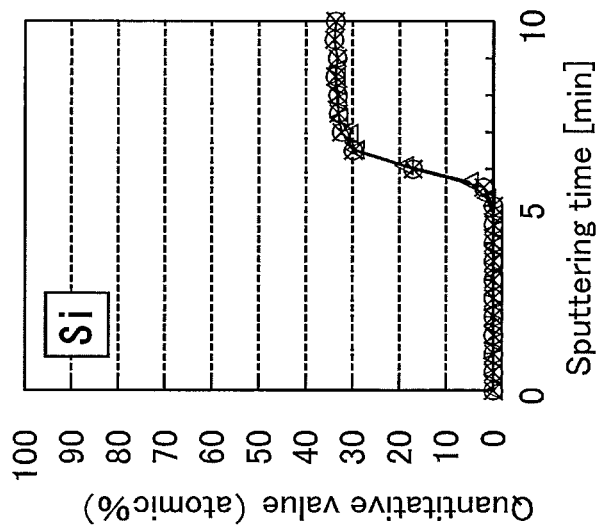
FIGS. 10A and 10B are graphs showing XPS analysis results.
Figure 10B:
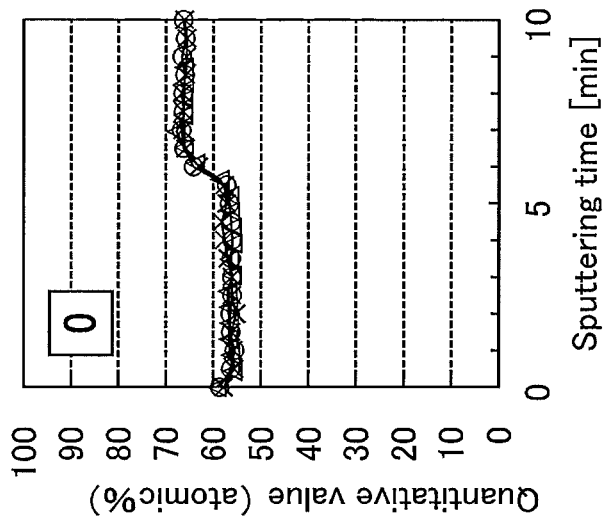
Figure 11A:
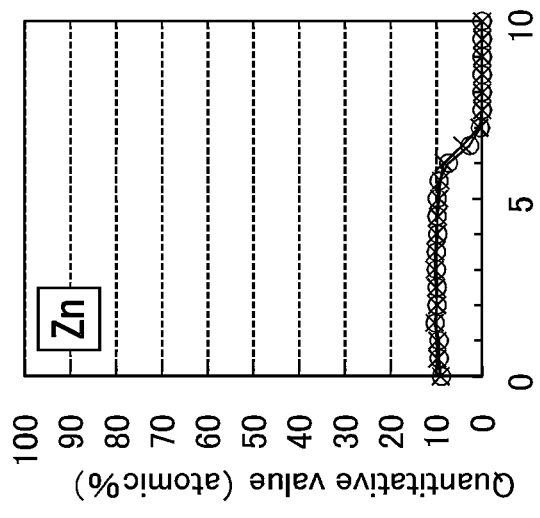
FIGS. 11A to 11C are graphs showing XPS analysis results.
Figure 11B:
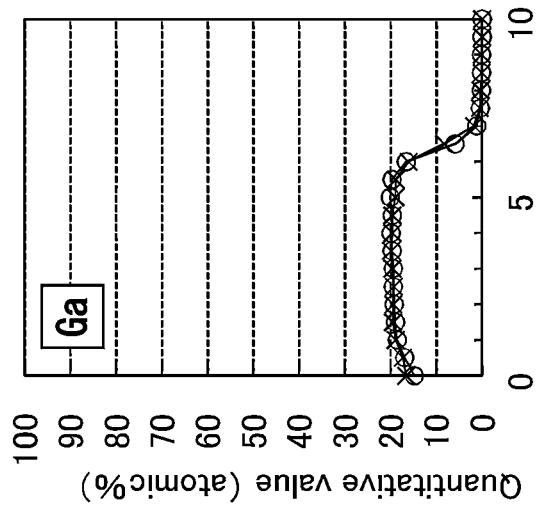
Figure 11C:
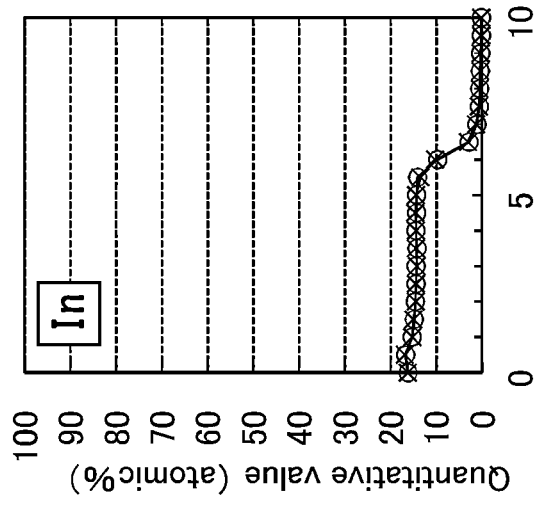
Figure 12A:
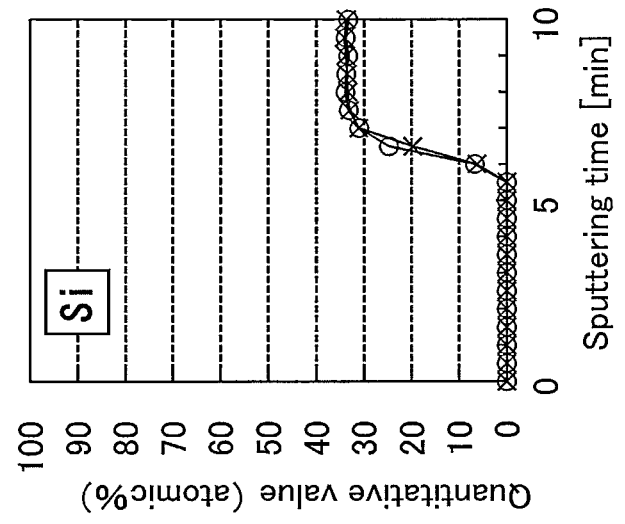
FIGS. 12A and 12B are graphs showing XPS analysis results.
Figure 12B:
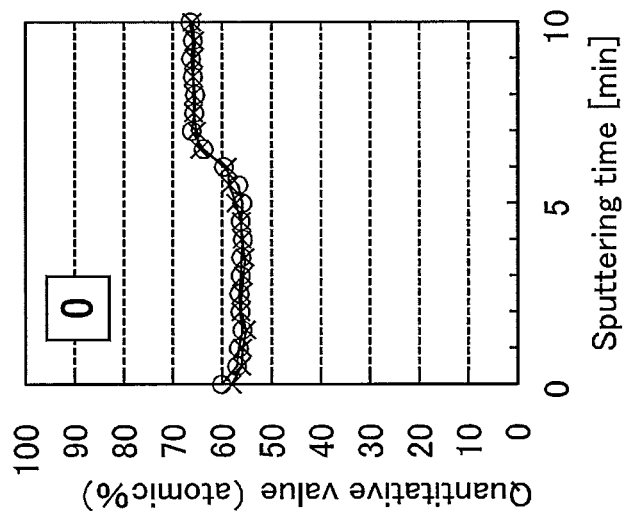

FIGS. 8A to 8C show atomic arrangement in a cross section of the inside of the nc-OS film. Note that FIG. 8A is a HAADF-STEM image, FIG. 8B is an enlarged view of a surrounded portion in FIG. 8A, and FIG. 8C shows a crystal structure model of $ZnGa_2O_4$.

According to FIGS. 7A to 7C, the cross section of the surface layer has the crystal structure of $InGaZnO_4$. According to FIGS. 8A to 8C, the cross section of the inside has the crystal structure of $ZnGa_2O_4$.

EXAMPLE 3

In Example 3, composition analysis of a CAAC-OS film and a nc-OS film that were In—Ga—Zn oxides were performed. Samples formed in this example are described.

First, a substrate was prepared. As a substrate of each sample, a quartz substrate was used. Then, an oxide semiconductor film (CAAC-OS film or nc-OS film) was formed over the substrate. The oxide semiconductor film was formed under the following conditions: a metal oxide target having an atomic ratio of In:Ga:Zn=1:1:1 (atomic ratio) was used as a sputtering target; argon and oxygen were supplied to a treatment chamber of a sputtering apparatus as a sputtering gas at flow rates of 30 sccm and 15 sccm, respectively; the pressure in the treatment chamber was controlled to 0.4 Pa; and a DC power of 0.5 kW was supplied. In addition, for formation of the nc-OS film, the substrate temperature at which the In—Ga—Zn oxide film was deposited was set to room temperature (25° C.). Further, for formation of the CAAC-OS film, the substrate temperature at which the In—Ga—Zn oxide film was deposited was set to 300° C. The thickness of each formed oxide semiconductor film was 35 nm.

The formed CAAC-OS film and the formed nc-OS film were subjected to laser treatment. For the laser treatment, an XeCl excimer laser (Lambda STEEL 2000) was used. The wavelength of the laser (λ) was 308 nm, and the pulse width was 25 nsec (full width at half maximum). The laser beam was made in a linear shape, and the substrate was scanned in a direction perpendicular to the longitudinal axis of the linear beam while being sprayed with $N_2$ at the room temperature (25° C.) so that the nc-OS film and the CAAC-OS film were irradiated with the linear laser beam. The scanning was performed at 1 mm/sec under such conditions that the beam width of the linear beam was about 320 μm and the repetition rate was 30 Hz; the number of shots of the laser beam with which one portion was irradiated was about 10.

In the laser treatment, the CAAC-OS film was irradiated with a laser whose energy density was 369 mJ/cm², whereas the nc-OS film was irradiated with a laser whose energy density was 369 mJ/cm² or 290 mJ/cm².

Through the above steps, the samples of this example were fabricated.

Next, the composition analysis of the formed samples was performed. In the composition analysis, the atomic quantitative values of the CAAC-OS film and the nc-OS film were measured by X-ray photoelectron spectroscopy (XPS), so that quantitative values of In atoms, Ga atoms, Zn atoms, O atoms, and Si atoms in the depth direction of each film were determined.

XPS analysis results are shown in FIGS. 9A to 9C, FIGS. 10A and 10B, FIGS. 11A to 11C, and FIGS. 12A and 12B. In each of FIGS. 9A to 9C, FIGS. 10A and 10B, FIGS. 11A to 11C, and FIGS. 12A and 12B, the horizontal axis indicates the sputtering time (min), and the vertical axis indicates the quantitative values (atomic %). Note that in FIGS. 9A to 9C and FIGS. 10A and 10B, circles represent samples irradiated with a laser beam whose energy density was 369 mJ/cm², and crosses represent samples which were not subjected to the laser treatment. The circles and the crosses overlap with each other. Further, in FIGS. 11A to 11C and FIGS. 12A and 12B, circles represent samples irradiated with a laser beam whose energy density was 369 mJ/cm², triangles represent samples irradiated with a laser beam whose energy density was 290 mJ/cm², and crosses represent samples which were not subjected to the laser treatment. The circles, triangles, and crosses overlap with each other.

From the above results, it is found that a change in composition does not occur whether the laser treatment is performed or not.

This application is based on Japanese Patent Application serial no. 2013-056982 filed with Japan Patent Office on Mar. 19, 2013, the entire contents of which are hereby incorporated by reference.

What is claimed is:

1. A method for manufacturing a semiconductor device, comprising the steps of:
forming an oxide semiconductor film including a microcrystal over a substrate, the oxide semiconductor film comprising indium, gallium, and zinc;
irradiating the oxide semiconductor film with an energy beam, whereby a surface layer of the oxide semiconductor film and an inside of the oxide semiconductor film comprise a first crystal structure and a second crystal structure respectively; and
removing the surface layer of the oxide semiconductor film comprising the first crystal structure so as to expose the second crystal structure,
wherein the first crystal structure is different from the second crystal structure.

2. The method for manufacturing a semiconductor device according to claim 1, wherein the first crystal structure is homologous, and
wherein the second crystal structure is spinel.

3. The method for manufacturing a semiconductor device according to claim 1, wherein the irradiating step is performed using an excimer laser.

4. The method for manufacturing a semiconductor device according to claim 1,
wherein a peak at 2θ around 36° is observed from the inside of the oxide semiconductor film irradiated with the energy beam by an out-of-plane method using XRD.

5. A method for manufacturing a semiconductor device, comprising the steps of:
forming an oxide semiconductor film including a microcrystal over a substrate, the oxide semiconductor film comprising indium, gallium, and zinc;
irradiating the oxide semiconductor film with an energy beam, whereby the oxide semiconductor film irradiated with the energy beam has a region that is homologous in a surface layer of the oxide semiconductor film and a region that is spinel in an inside of the oxide semiconductor film;
removing the surface layer of the oxide semiconductor film so as to expose the region that is spinel;
forming a source electrode and a drain electrode over the oxide semiconductor film;
forming a gate insulating film over the source electrode and the drain electrode; and
forming a gate electrode over the gate insulating film.

6. The method for manufacturing a semiconductor device according to claim 5, wherein the source electrode is formed using a transparent conductive material.

7. The method for manufacturing a semiconductor device according to claim 5, wherein the irradiating step is performed using an excimer laser.

8. The method for manufacturing a semiconductor device according to claim 5,
wherein a peak at 2θ around 36° is observed from the inside of the oxide semiconductor film irradiated with the energy beam by an out-of-plane method using XRD.

* * * * *